United States Patent
Van Ostrand et al.

(10) Patent No.: US 10,205,343 B2
(45) Date of Patent: Feb. 12, 2019

(54) SMART POWER NODE

(71) Applicants: Daniel K. Van Ostrand, Pflugerville, TX (US); Thomas L Peterson, Fairfax Station, VA (US)

(72) Inventors: Daniel K. Van Ostrand, Pflugerville, TX (US); Thomas L Peterson, Fairfax Station, VA (US)

(73) Assignee: Unilectric, LLC, Round Rock, TX (US)

( * ) Notice: Subject to any disclaimer, the term of this patent is extended or adjusted under 35 U.S.C. 154(b) by 198 days.

(21) Appl. No.: 15/139,407

(22) Filed: Apr. 27, 2016

(65) Prior Publication Data

US 2017/0025892 A1    Jan. 26, 2017

Related U.S. Application Data

(60) Provisional application No. 62/153,975, filed on Apr. 28, 2015.

(51) Int. Cl.
| | |
|---|---|
| *G05B 15/02* | (2006.01) |
| *H02J 13/00* | (2006.01) |
| *G01R 19/25* | (2006.01) |
| *H02H 1/00* | (2006.01) |
| *H02H 1/04* | (2006.01) |
| *H02H 3/04* | (2006.01) |
| *H02H 3/05* | (2006.01) |
| *H02H 3/08* | (2006.01) |

(Continued)

(52) U.S. Cl.
CPC .......... *H02J 13/00* (2013.01); *G01R 19/2513* (2013.01); *G05B 15/02* (2013.01); *H02H 1/0015* (2013.01); *H02H 1/04* (2013.01); *H02H 3/044* (2013.01); *H02H 3/05* (2013.01); *H02H 3/08* (2013.01); *H02H 3/093* (2013.01); *H02H 3/16* (2013.01); *H02H 3/33* (2013.01); *H02H 3/38* (2013.01); *H02H 7/26* (2013.01); *H02H 3/207* (2013.01); *H02H 3/247* (2013.01)

(58) Field of Classification Search
CPC ......... H02J 13/00; G05B 15/02; H02H 3/093; H02H 7/26; H02H 3/33; H02H 1/0015; H02H 1/04; H02H 3/38; H02H 3/08; H02H 3/05; H02H 3/044; H02H 3/16; H02H 3/207; H02H 3/247; G01R 19/2513
USPC .................................................. 700/292–300
See application file for complete search history.

(56) References Cited

U.S. PATENT DOCUMENTS 4,318,156 A * 3/1982 Gallagher ................ H02B 1/52
                                                            307/147
5,982,596 A * 11/1999 Spencer .................... H02H 3/04
                                                            361/102

(Continued)

*Primary Examiner* — Ziaul Karim

(57) ABSTRACT

A portable electrical energy power node is provided. The power node includes first and second input power terminals and first and second output power terminals. The input power terminals are adapted for receiving a source of electrical power and the output terminals are adopted for connecting to a load. A first power line connects the first input terminal to the first output terminal, a second power line connects the second input terminal to the input side of a circuit interrupter and a third power line connects the output side of the circuit interrupter to the second output terminal. The circuit interrupter selectively interrupts the connection between the second input terminal and the second output terminal in accordance with a fault sensor and a control unit.

31 Claims, 9 Drawing Sheets

(51) Int. Cl.
*H02H 3/093* (2006.01)
*H02H 3/16* (2006.01)
*H02H 3/33* (2006.01)
*H02H 3/38* (2006.01)
*H02H 7/26* (2006.01)
H02H 3/20 (2006.01)
H02H 3/247 (2006.01)

(56) References Cited

U.S. PATENT DOCUMENTS

| | | | |
|---|---|---|---|
| 2007/0059986 A1* | 3/2007 | Rockwell | G01R 19/2513 439/638 |
| 2008/0019068 A1* | 1/2008 | Reynolds | G06F 1/26 361/93.1 |
| 2012/0091824 A1* | 4/2012 | Campolo | B60L 11/1818 307/135 |
| 2014/0254050 A1* | 9/2014 | Haines | G01R 31/3277 361/42 |
| 2015/0109077 A1* | 4/2015 | Tomimbang | H01H 83/20 335/7 |
| 2015/0249337 A1* | 9/2015 | Raneri | H02J 3/005 307/24 |

* cited by examiner

SMART POWER NODE

TECHNICAL FIELD

The present invention generally relates to the field of energy use and more particularly, is directed to a smart power node that can be installed at any location in an electric power distribution system for monitoring and controlling electrical energy consumption.

BACKGROUND

In many cases, an electric load is connected directly to a branch circuit which is protected by an upstream device, such as a circuit breaker in a power distribution panel. More than one load usually is connected to the same branch circuit. Thus, when a fault condition is detected and the breaker trips, all of the connected loads lose power. Loss of power to all of the loads often creates substantial hardship to users if the fault is not quickly corrected or isolated.

In other cases, electric loads are connected to the edge of a power distribution system through power extenders, such as extension cords, power strips and power adapters. When connected in this manner, loads are even further removed from the upstream branch circuit protection device, thereby increasing the likelihood that a fault condition elsewhere in the system will adversely affect the load.

Prior art power extenders and edge connected loads are not easily monitored and independently controlled by devices that reside on a branch circuit or within a power distribution panel. Thus, there is a need in the art for such monitoring and control. Moreover, the monitoring and control capability should easily be deployable anywhere within a power distribution system, and especially at it edges, on an ad hoc basis when and where needed.

BRIEF DESCRIPTION OF THE DRAWINGS

The novel features of the present invention are set out with particularity in the appended claims, but the invention will be understood more fully and clearly from the following detailed description of the invention as set forth in the accompanying drawings in which:

DESCRIPTION OF THE PREFERRED EMBODIMENT

A preferred embodiment of the present invention will be described with reference to the figures.

Figure 1:
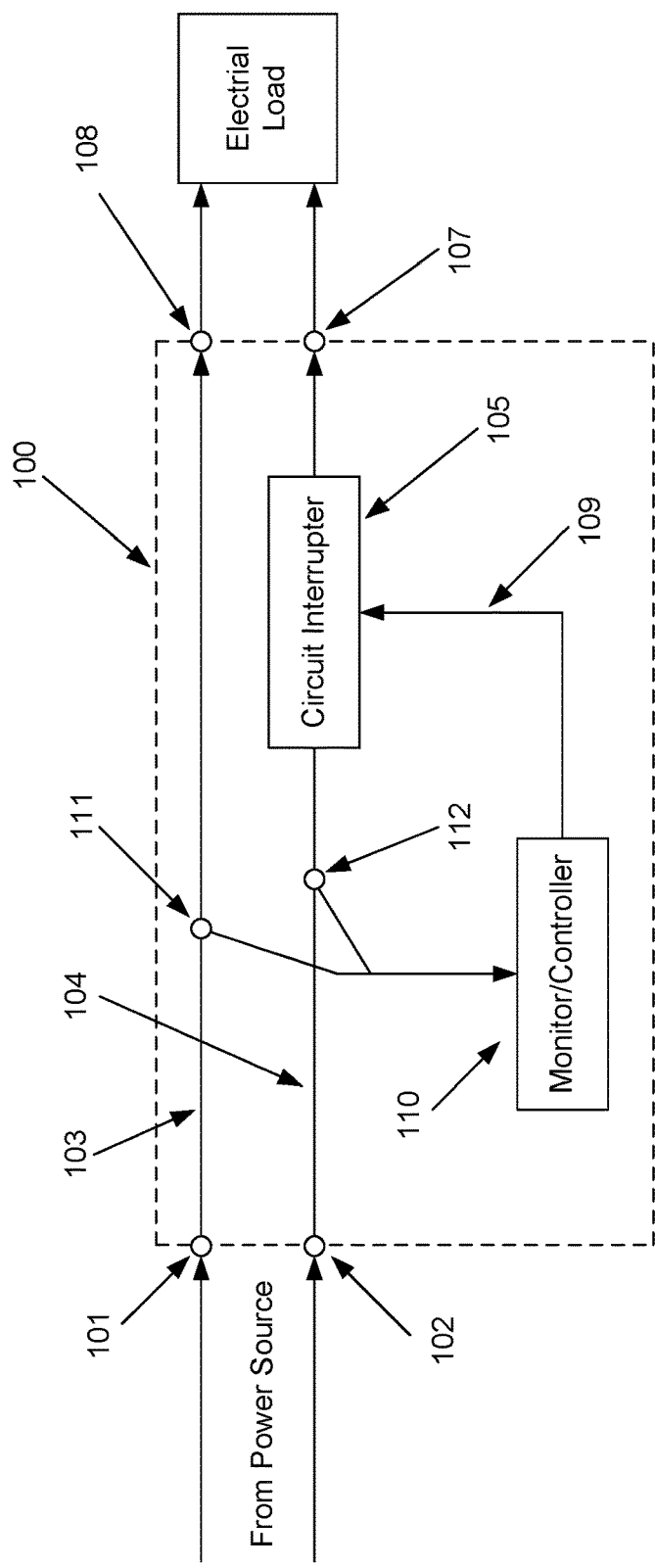
FIG. 1 is a block diagram of a smart power node in accordance with one embodiment of the present invention.

FIG. 1 is a block diagram of one embodiment of the present invention in the form of a smart power node 100. In this embodiment, the current and voltage from a power source is monitored for certain conditions which can be used to determine whether power to an attached load should be interrupted.

Figure 7:
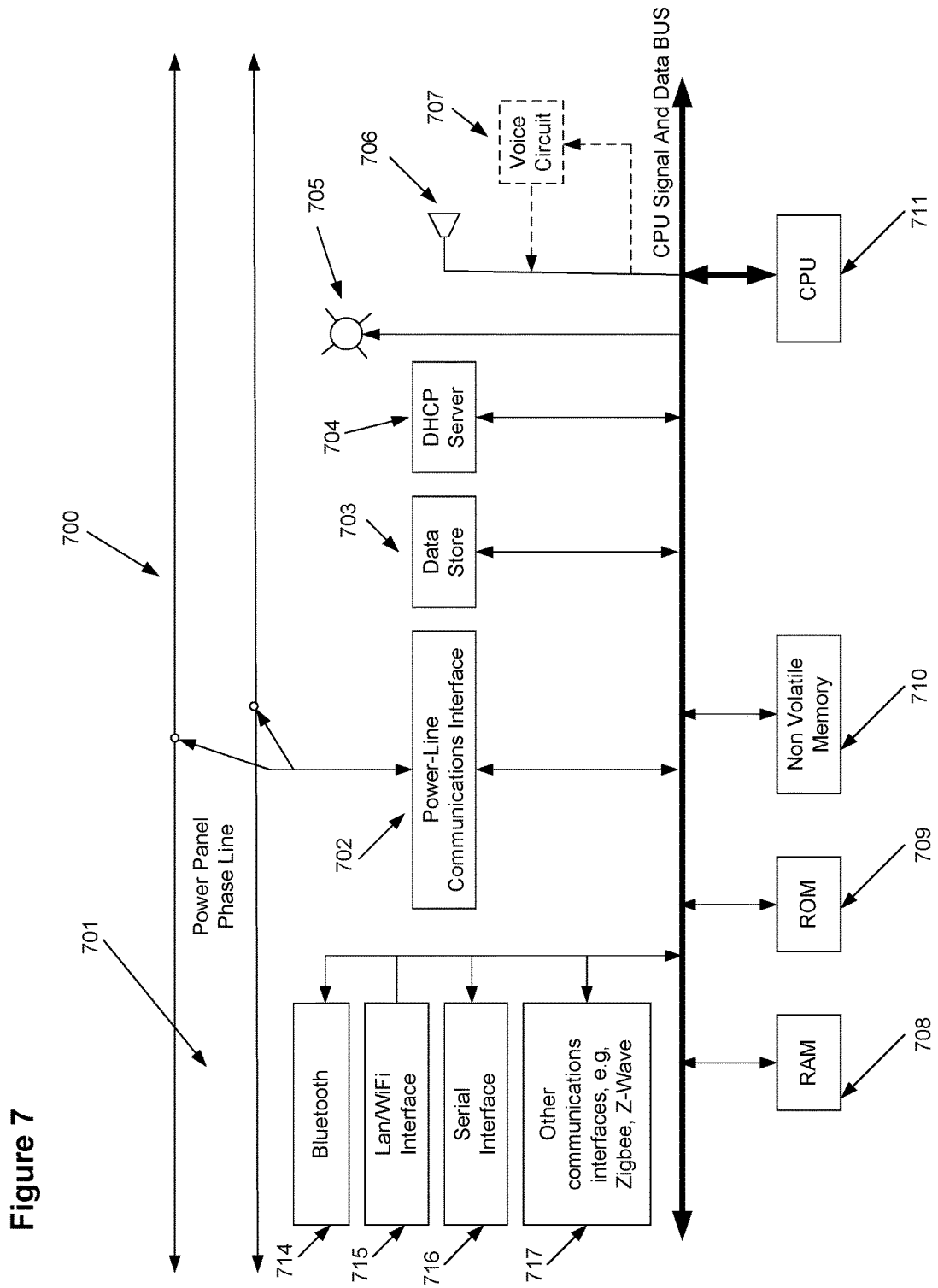
FIG. 7 is a block diagram of one embodiment of a Master Control System for smart power nodes in accordance with the present invention.

The data obtained from monitoring source power lines can also be communicated to a central location, such as the Master Control System shown in FIG. 7, for retention and/or analysis.

Such analysis might include waveform analysis relating to the electronic signature of connected loads. The signature information may be shared with other systems for further analysis and historical comparisons.

Depending on how power node 100 is configure, as will be described with respect to FIG. 2, power node 100 may simply be a monitoring station reporting data to the Master Control System and/or be under the control of the Master Control System.

Power node 100 can be deployed anywhere in a power distribution system where monitoring and/or control of connected loads is desired, including within electrical power extenders such as extension cords, power strips, power adapters and the like. Power node 100 can operate independently or operate within a network with other power nodes as will be described with respect to FIG. 2.

As illustrated in FIG. 1, electrical power from a power source is connected to power lines 103 and 104 of power node 100 via electrical contacts 101 and 102. Circuit interrupter 105 selectively breaks continuity of power line 104 to electrical contact 107. Contacts 107 and 108 allow an electric load to be connected to the power node.

Interrupter 105 may be formed of mechanical components which are activated by a solenoid that can be triggered by an electrical signal as is known in the art. Interrupter 105 may also be formed of a solid-state device, such as a triac, as also known in the art. In the present invention, the operation of interrupter 105 is controlled by a control trigger signal 109 from Monitor/Controller 110 in a manner described below with reference to FIG. 3.

Monitor/Controller 110 is connected to power lines 103 and 104 via connection points 111 and 112.

Figure 2:
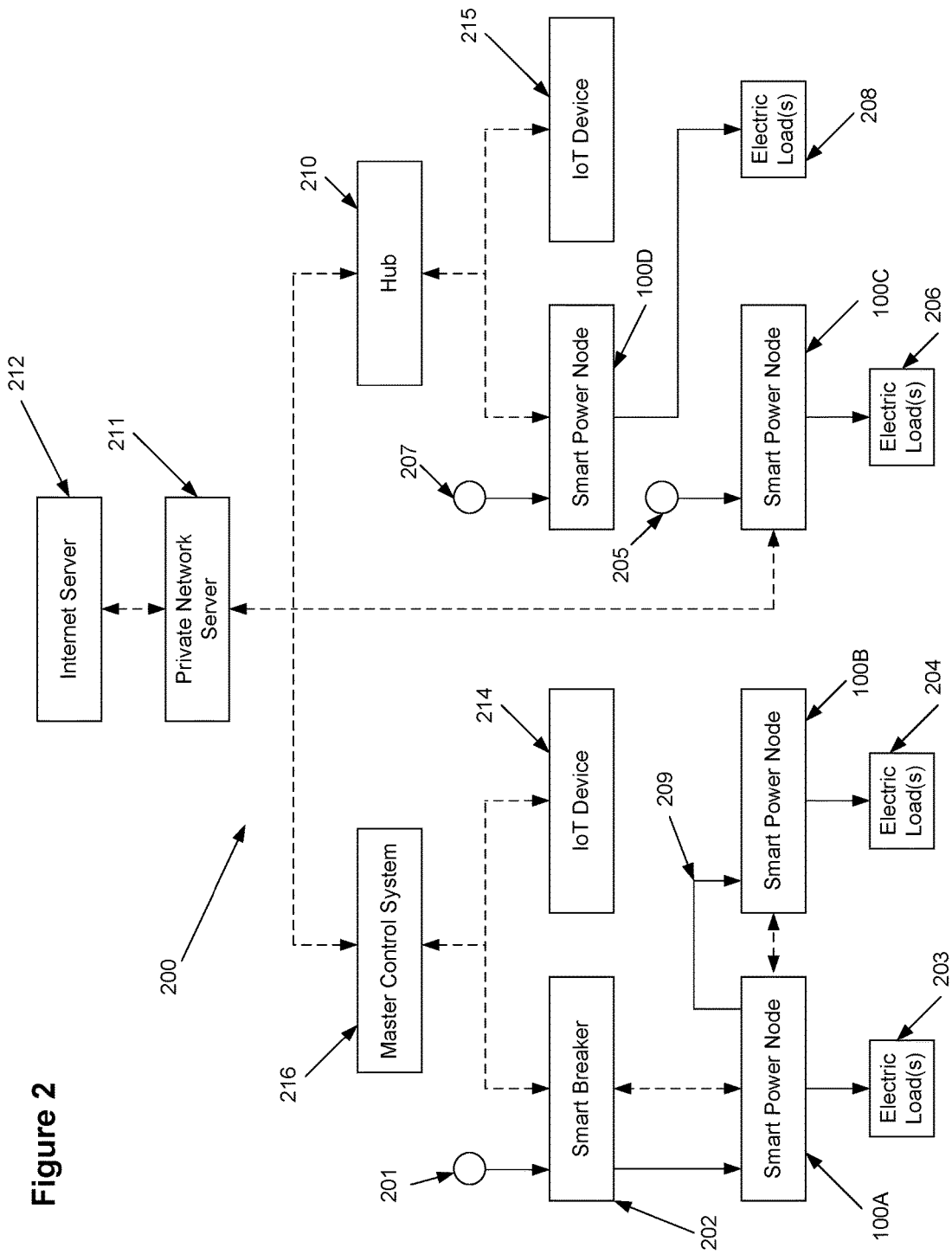
FIG. 2 is block diagram of a plurality of smart power nodes formed into a network in accordance with the present invention.

FIG. 2 is block diagram of a network architecture illustrating a plurality of smart power nodes 100A-100D which are integrated into an electric power control network. In accordance with the present invention, the number of smart power nodes in the network can be as many as required.

FIG. 2 depicts in dashed lines the signal and data communication path between various devices on the network. Each power node receives it electrical power from various sources as may be determined by the user. For example, smart power node 100A receives its power from power line 201 through smart breaker 202 which may be located in a power panel. Thus, contacts 101 and 102 of the power node, as shown in FIG. 1, may be formed in the manner of electrical contact blades that are adapted to be plugged into a conventional wall receptacle as one of ordinary skill in the art would know. Power node 100A monitors and controls the power supplied to one or more electrical loads 203.

Smart power node 100B receives its power from smart power node 100A and monitors and controls the power supplied to one or more electrical loads 204.

Smart power node 100C receives its power from power source 205, which can be one of any number of power sources. Power node 100C monitors and controls the power supplied to one or more electrical loads 206.

Smart power node 100D receives its power from power source 207, which can also be one of any number of power sources. Power node 100D monitors and controls the power supplied to one or more electrical loads 208.

Each smart power nodes 100A-100D can independently be configured for their particular application and use. For example, power node 100B may be configured only to monitor voltage, current and/or fault conditions with respect to power line 109 but may not have the ability to interrupt power to load 204 when a fault condition is detected. The interrupt function may be the responsibility of power node 100A when it detects the same fault.

As illustrated by dashed lines in FIG. 2, power nodes 100A-100D may communicate monitoring data to a hub 210, which can forward the data to server 211 which might reside on a private network associated with the building or structure that is serviced by the electrical system.

The data can be analyzed for a number of purposes using application software running on server 211. The results of the analysis can be used to configure each of power nodes 100A-100D for their particular purpose and location. Server 211 may also forward the data on to Internet server 212 for wider distribution and/or further analysis, alone or in combination with data provided to server 212 from other systems.

Server 212 allows a stakeholder associated with the building to log into server 212 with appropriate credentials as one skilled in the art would know and to review the monitored data. The same can be done with respect to server 211 using a virtual private network connection.

FIG. 2 also illustrates IoT Devices 214 and 215. The Internet of Things (IoT) is the term used to describe a developing concept where common objects will have network connectivity and can share data with other objects and with the outside world. Smart power nodes 100A-100D follows this concept.

Figure 3:
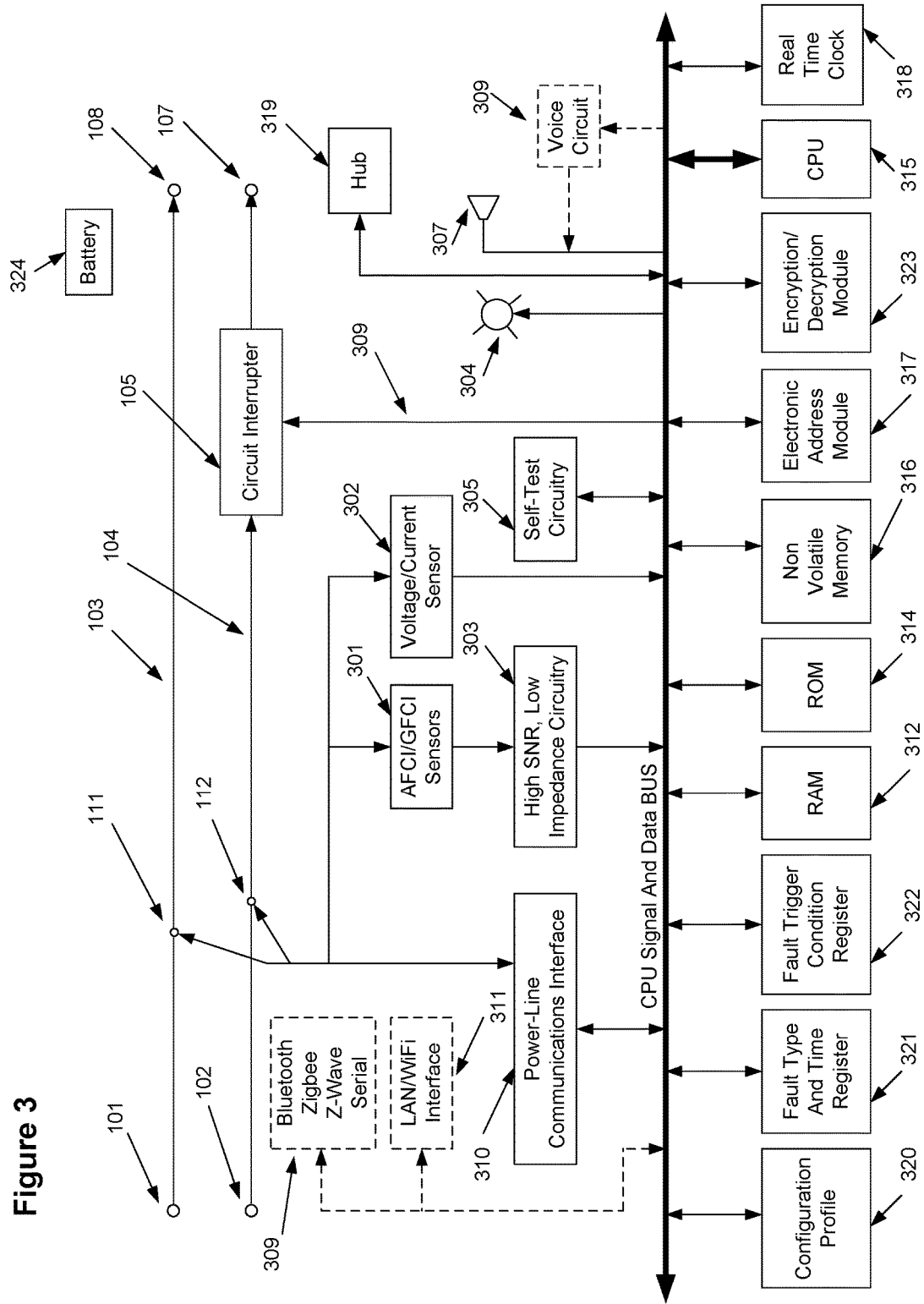
FIG. 3 is a block diagram of a monitor and controller used in a smart power node in accordance with the present invention.

FIG. 3 is a block diagram of one embodiment of Monitor/Controller 110 shown in FIG. 1. Corresponding reference numbers from FIG. 1 are retained in FIG. 3 where appropriate.

Monitor/Controller 110 includes GFCI/AFCI sensors 301 and voltage/current sensor 302 which are coupled to circuit interrupter 105. GFCI/AFCI sensor 301 is configured to provide fault sense signals to CPU 315 over the CPU Signal And Data BUS (hereafter, "CPU BUS") via High Signal-to-Noise ratio, Low Impedance Circuitry (SNR) 303. SNR 303 improves the performance of fault detection for smart power node 100.

Voltage/current sensor 302 provides voltage and current signals to CPU 315 over the CPU BUS. With the voltage and current signals from voltage/current sensor 302, and fault sense signals from the GFCI/AFCI sensor 301, CPU 315 can identify faults, including overload faults caused by the attached load, AFCI faults and GFCI faults.

When a fault occurs, CPU 315 stores the fault type and the time of its occurrence in fault type and time register 321. CPU 315 can also can be programmed with the conditions upon which interrupter 105 will be triggered in response to detected faults. These conditions are stored in fault trigger condition register 322. Initially, default trigger conditions can be stored in register 322 and then changed as required.

Monitor/Controller 110 also includes a real time clock 318 which assist in keeping track of timed events, such as the time of day, time of a particular fault and elapsed time since a last fault.

If CPU 315 identifies a fault, one or more of three events can occur.

First: CPU 315 can output trigger signal 309 to circuit interrupter 105 to break continuity of power line 104 to contact 107. CPU 315 can also trigger a visual indication of the fault condition such as by illuminating an LED light 304 or sounding an audio alarm through speaker 307 or other audio device. LED 304 can also be a multi-color device, each color indicating the type of fault condition. The audio alarm may also be in the form of a synthesized human voice from voice circuit 309 in accordance with the nature and severity of the fault.

Monitor/Controller 110 continuously monitors line 103 and 104 and status indicators are updated as required. Thus, should the fault condition clear, the continuity of line 104 to the attached load can be restored by CPU 315 sending an appropriate signal to circuit interrupter 105. In some circumstances, however, continuity may not be restored until other conditions are satisfied, such as by the intervention of a human pressing a manual reset button.

Second: Instead of triggering circuit interrupter 105 directly to break the continuity of power line 104 to contact 107, CPU 315 may cause all, or selected fault signals, to be send to the Master Control System 216 illustrated in FIG. 2 via Power-Line Communications Interface 310 for processing and disposition. Alternative communications technologies may also be used, such as LAN/WiFi interface 311, or Bluetooth 309. Alternative communications technologies also include an RS-232 serial line, Zibgee, XBee and Z-Wave.

In situations where security of the data is of concern, the data may be encrypted using encryption/decryption module 323 in accordance with one of a number of encryptions methods and routines as is known in the art.

Upon receiving the fault signals, the Master Control System may response by sending a command to CPU 315 to break the continuity of power line 104 or continue continuity.

Third: CPU 315 may trigger circuit interrupter 105 to break the continuity of power line 104 to contact 107 as well as send the fault signal to Master Control System 216 illustrated in FIG. 2.

Monitor/Controller 110 may also include self-test circuitry 305 coupled to CPU 315 via the CPU BUS. Self-test circuitry 305 enables test signals to be sent to and from the Master Control System via, for example, Power-Line Communications Interface 310 to test the overall functionality of smart power node 100.

Self-test circuitry 305 may include a test button that can be pressed in order to initiate the self-test or a self-test may be initiated by the Master Control System.

CPU 315 is used for executing computer software instructions as is known in the art. In addition to the elements described above, CPU 315 is coupled to a number of other elements via the CPU BUS.

These elements include RAM 312 (Random Access Memory) which may be used to store computer software instructions, ROM 314 (Read Only Memory) which may also be used to store computer software instructions, and Non Volatile Memory 316 which may be used to store computer software instructions as well.

Electronic Address Module 317 provides a unique electronic address for power node 100. Thus, power node 100 can be uniquely addressed by the Master Control System. The address stored in Electronic Address Module 317 is implemented as a unique series of numbers. An example of such an addressing scheme is an Internet Protocol address based on IPv4 or IPv6 as is known in the art. The address can also be static or a dynamic IP address.

Monitor/Control 110 may also include a packet switch network hub 319 which can communicate with a local or remote server through, for example, Power-Line Communications Interface 310.

As also shown in FIG. 3, battery 324 is used to provide electrical power to Monitor/Controller 110 when smart power node 100 is not receiving power from a power source.

Figure 4:
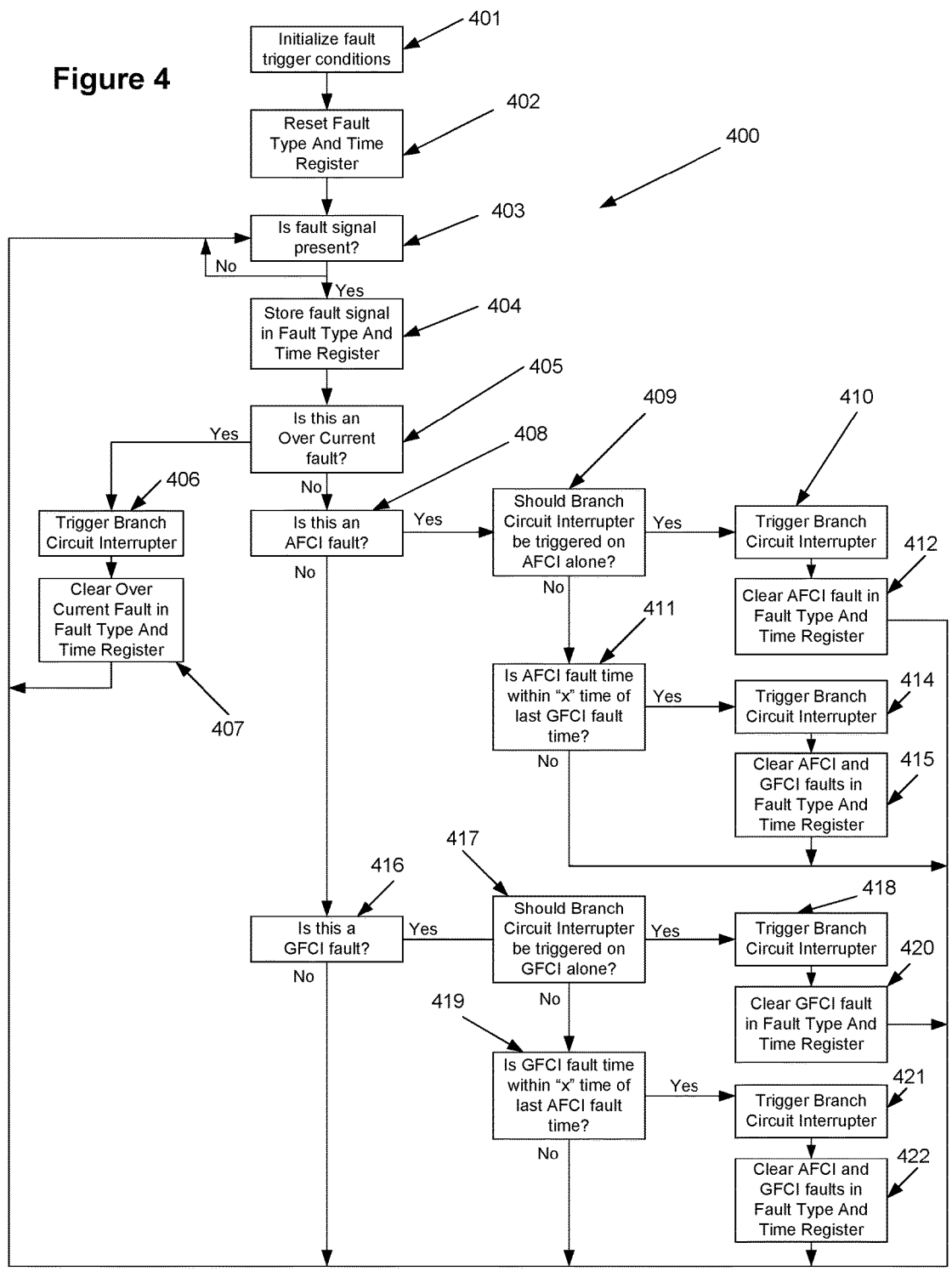
FIG. 4 is a flow chart illustrating the operation of the monitor and controller illustrated in FIG. 3.

FIG. 4 is a flow chart 400 that illustrates the operation of Monitor/Control 110 as depicted FIG. 3.

In step 401, the fault trigger conditions for smart power node 100 are initialized and stored in fault trigger condition register 322.

In step 402, fault type and time register 321 is reset to indicate no active or previous fault conditions.

In step 403, is decision is made whether a fault signal is present from GFCI/AFCI sensor 301 or from voltage/current sensor 302. If a fault signal is present, the process continues to step 404. If no fault signal is present, the process loops so that step 403 can make another decision whether a fault signal is present.

In step 404, the fault signal is stored in fault type and time register 321.

In step 405, a decision is made whether the fault signal is an over current fault. If yes, circuit interrupter 105 is trigger to interrupt power to contact 107 in step 406 and the over current fault condition previously stored in fault type and time register in step 404 is cleared in step 407. The process then loops back to step 403.

If step 405 determines that the fault condition is not an over current fault, a decision is made in step 408 whether the fault is an AFCI fault.

In the case of an AFCI fault, a decision is made in step 409 whether circuit interrupter 105 should be triggered based solely on the presence of the AFCI fault condition. If yes, interrupter 105 is triggered in step 410, fault type and time registered 321 is cleared of the AFCI fault in step 412 and the process loops back to step 403.

If step 409 determines that circuit interrupter 105 should not be triggered on the basis of the AFCI fault alone, a decision is made whether interrupter 105 should be triggered based on an addition fault condition. One example of an addition fault condition, as depicted in step 411, is that a prior GFCI fault occurred within a predetermined time "x" of the current AFCI fault condition. Other fault conditions can be used as well as those of ordinary skill in the art will understand.

If the conditions for triggering circuit interrupter 105 are satisfied in step 411, interrupter 105 is triggered in step 414, fault type and time registere 321 is cleared of the AFCI and GFCI faults in step 415 and the process loops back to step 403. If the conditions for triggering interrupter 105 are not satisfied in step 411, the process loops back to step 403.

If step 408 determines that the fault is not an AFCI fault, the process continues to step 416. In step 416, a decision is made whether the fault is a GFCI fault.

In the case of a GFCI fault, a decision is made in step 417 whether circuit interrupter 105 should be triggered based solely on the presence of the GFCI fault condition. If yes, interrupter 105 is triggered in step 418, fault type and time registered 321 is cleared of the GFCI fault in step 420 and the process loops back to step 403.

If step 417 determines that circuit interrupter 105 should not be triggered on the basis of the GFCI fault alone, a decision is made whether interrupter 105 should be triggered based on an addition fault condition. An example of an addition fault condition, as depicted in step 419, is that a prior AFCI fault occurred within a predetermined time "x" of the current GFCI fault condition. Other fault conditions can be used as well as those of ordinary skill in the art will understand.

If the conditions for triggering circuit interrupter 105 are satisfied in step 419, interrupter 105 is triggered in step 421, fault type and time registered 321 is cleared of the AFCI and GFCI faults in step 422 and the process loops back to step 403. If the conditions for triggering interrupter 105 are not satisfied in step 419, the process then loops back to step 403.

If step 416 determines that the current fault is not a GFCI fault, the process loops back to step 403.

Figure 5:
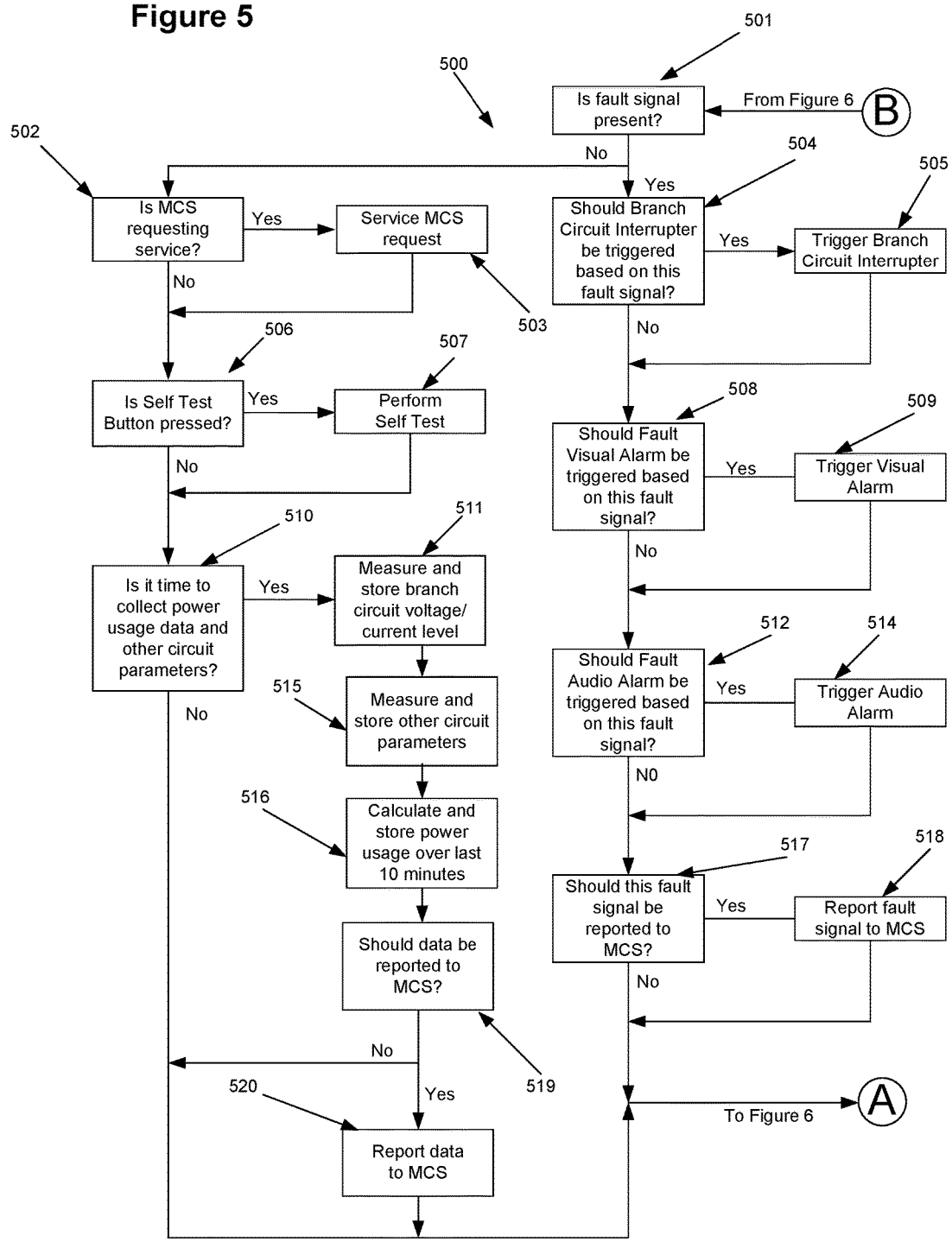
FIGS. 5 and 6 is a flow chart illustrating the operation of the smart power node network illustrated in FIG. 2.
Figure 6:
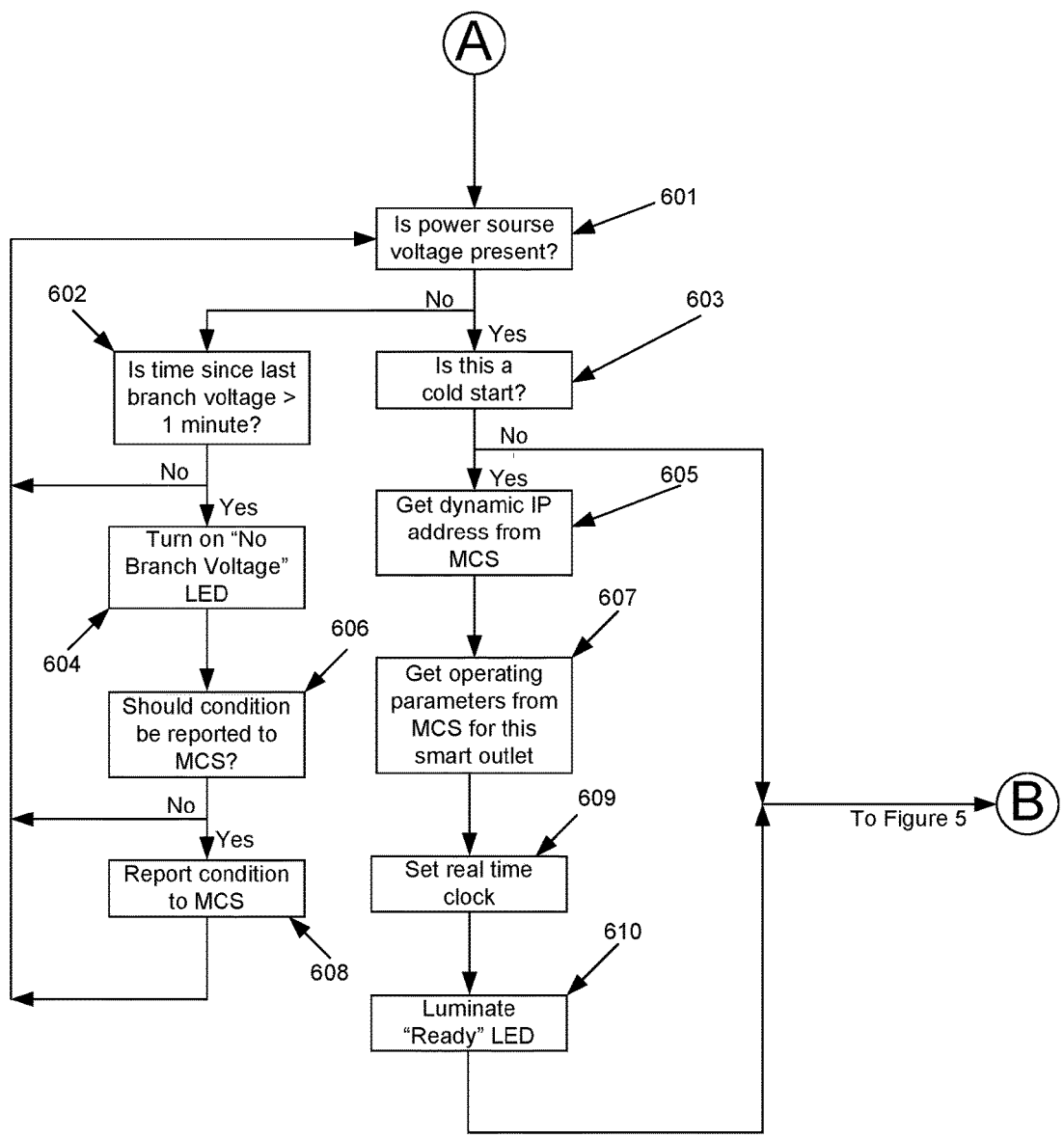

FIGS. 5 and 6 is a flow chart 500 that illustrates the operation of smart power node 100 when used in a network configuration, such as illustrated in FIG. 2.

In step 501, a decision is made whether a fault signal is present. If yes, the process proceeds to step 504 where a decision is made whether circuit interrupter 105 should be triggered based on this fault signal. If yes, interrupter 105 is triggered in step 505 and the process continues to step 508. Otherwise, the process continues directly to step 508

In step 508, a decision is made whether a visual fault alarm should be triggered based on this fault. If yes, the visual alarm is triggered in step 509 and the process continues to step 512. Otherwise, the process continues directly to step 512.

In step 512, a decision is made whether an audio fault alarm should be triggered based on this fault. If yes, an audio alarm is triggered in step 514 and the process continues to step 517. Otherwise, the process continues directly to step 517.

In step 517, a decision is made whether the fault should be reported to the Master Control System. If yes, the fault is reported to the Master Control System in step 518 and the process continues to step 601 in FIG. 6. Otherwise, the process continues directly to step 501 in FIG. 5.

In step 601, a decision is made whether a power source voltage is present as indicated by the signal from voltage/current sensor 302 in FIG. 3. If yes, the process continues to step 603 where a decision is made whether this is a cold start as if smart power node 100 is connected to a power source for the first time. If yes, a dynamic IP address is obtained from the Master Control System in step 605. Otherwise, the process loops back to step 501 in FIG. 5. If a static IP has already been assigned to smart node 100 there will not be a need to obtain a dynamic IP in step 605

In step 607, the operating parameters for smart power node 100 are obtained from the Master Control System and in step 609 real time clock 318 in FIG. 3 is set. The operating parameters may also be obtained from private network server 211 or Internet server 212 illustrated in FIG. 2. Smart power node 100 may also be preconfigured with default operating parameters.

The process then proceeds to step 610 where a ready light, for example, a green light from LED light 304 in FIG. 3, is illuminated to indicate that power node 100 is in a ready state.

The process then continues in step 501 in FIG. 5.

If in step 601, a determination is made that no power source voltage is present, the process continues to step 602.

In step 602, a decision is made whether the time since the power source voltage was present is greater than, for example, one minute. If no, the process loops back to step 601. Otherwise, the process continues to step 604.

In step 604, "a no branch voltage" visual indication is provided by LED light 304, as for example, by lighting a red light not ready light. The process continues to step 606.

In step 606, a decision is made whether the status condition of power node 100 should be reported to the Master Control System. If yes, the condition is reported in step 608 and the process loops back to step 601. Otherwise, the process directly loops back to step 601.

Returning now to FIG. 5, if the determination in step 501 is that a fault signal is not present, the process continues to step 502.

In step 502, a determination is made whether the Master Control System is requesting service from smart power node 100. The requested service can be a request to communicate with power node 100 to, for example, obtain the status of fault conditions, provide new conditions under which circuit interrupter 105 should be triggers, provide updated firmware for the operation of CPU 315, etc.

If yes, the Master Control System is serviced in step 503 and the process continues to step 506. Otherwise, the process continues directly to step 506.

In step 506, a determination is made whether a self-test of power node 100 should be performed. If yes, the self-test is performed in step 507 and the process continues to step 510.

In Step 510, a determination is made whether electrical power usage data and other circuit parameters should be collected. If yes, power usage data and circuit parameters are determined and stored in steps 511, 515 and 516 by using sensor signals from voltage/current sensor 302 in FIG. 3.

In step 519, a decision is made whether the data should be reported to the Master Control System. If yes, the data is reported in step 520 and the process continues to step 601 in FIG. 6. Otherwise, the process continues directly to step 601.

FIG. 7 is a block diagram of one embodiment of a Master Control System (MCS) 700 in accordance with the present invention. As MCS 700 is able to communicate over the electrical wiring, it may operate from any location within an electrical power system.

For example, MCS 700 may be fabricated in the physical size of a conventional circuit breaker and be plugged into an electrical power panel, such as across one of the power phase lines in a power panel. MCS 700 may also be fabricated as an external module with electric power blades that can be plugged into a conventional electric wall outlet or receptacle to establish an electrical connection to the electrical system.

Moreover, MCS 700 may communicate with smart power nodes 100 using alternative communication path, such as via Bluetooth 714, Lan/WiFi Interface 715, Serial interface 716 and various other interfaces 717.

The operation of MCS 700 is controlled by CPU 711 which communicates with smart power nodes 100 over Power-Line Communications Interface 702 or one of the alternative communications paths. Status LED 705 and audio alarm 706 provide information on the status of MSC 700, which are also controlled by CPU 711 via the CPU Signal And Data BUS. Voice circuit 707 may also be used to provide status reports in the form of a sensitized voice.

Data Store 703 is provided for storing electrical fault, power consumption and circuit analysis information as might be reported by various smart power nodes.

DHCP server 704 provides dynamic IP addresses to smart power nodes 100 that might require such an address as is known in the art.

Also coupled to CPU 711 are RAM 708, ROM 709 and Non Volatile Memory 710. These elements operate in a similar manner as RAM 312, ROM 314 and Non Volatile Memory 316 operate with respect to CPU 315 as described with respect to FIG. 3.

Figure 8:
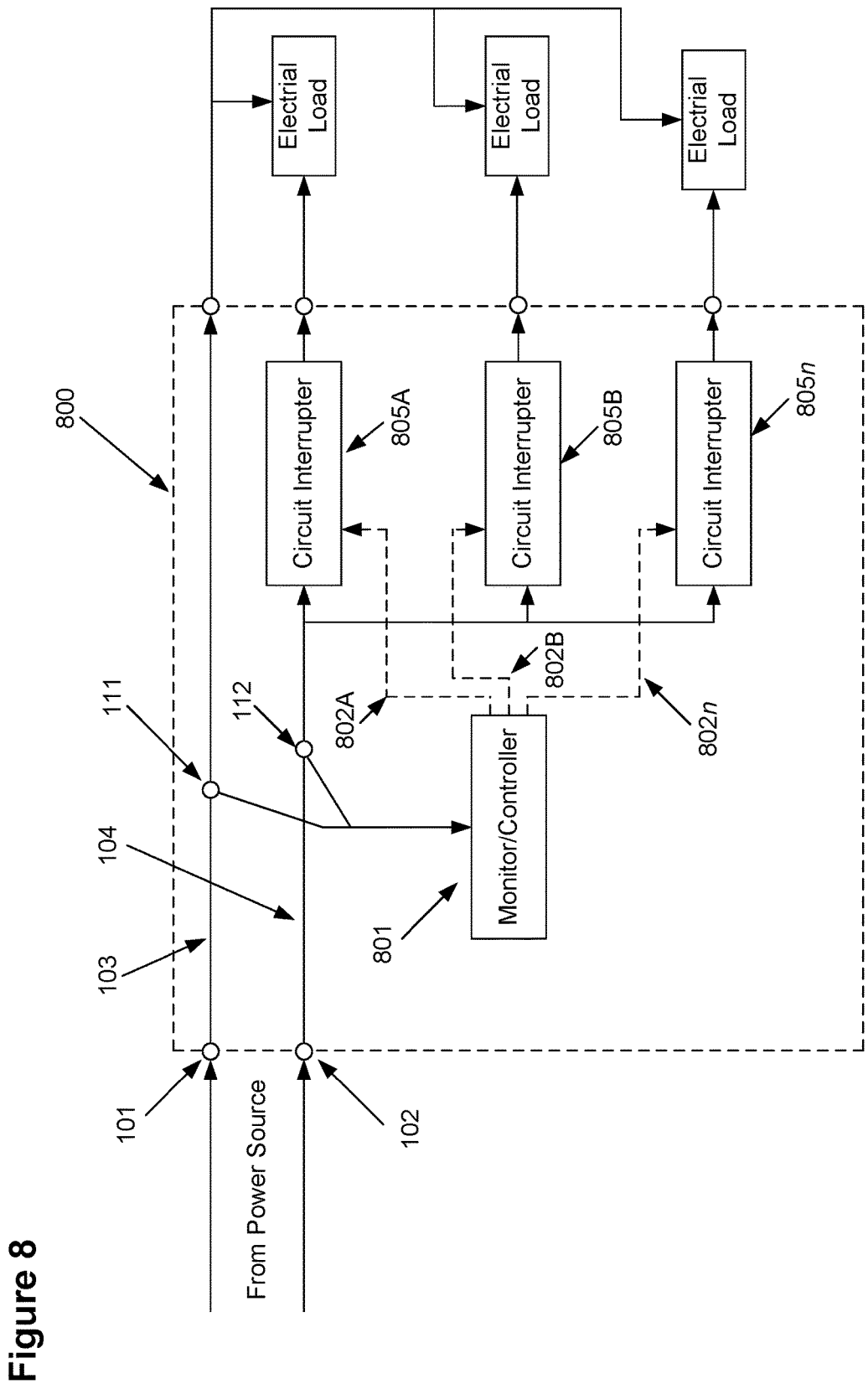
FIG. 8 is block diagram of another embodiment of a smart power node having a plurality of circuit interrupters in accordance with the present invention.

FIG. 8 is a block diagram of a further embodiment of a smart power node 800 in accordance with the present invention. In this embodiment, Monitor/Controller 801 is used to individually control electric power to a plural of loads using circuit interrupters 805A-805n. The circuit interrupters are controlled by control trigger lines 802A-802n.

Smart power node 800 may be formed in a power strip which provides a plurality of outlet receptacles as such power strips are known in the art.

Smart power nodes 100 and 800 may also be formed as an inline module that could be put into the wall (out of sight) or externally mounted and inserted into the electrical wiring between the outlet/device and the circuit breaker panel for existing outlets or other devices (such as outdoor pool pumps, spa pumps, etc.)

Figure 9:
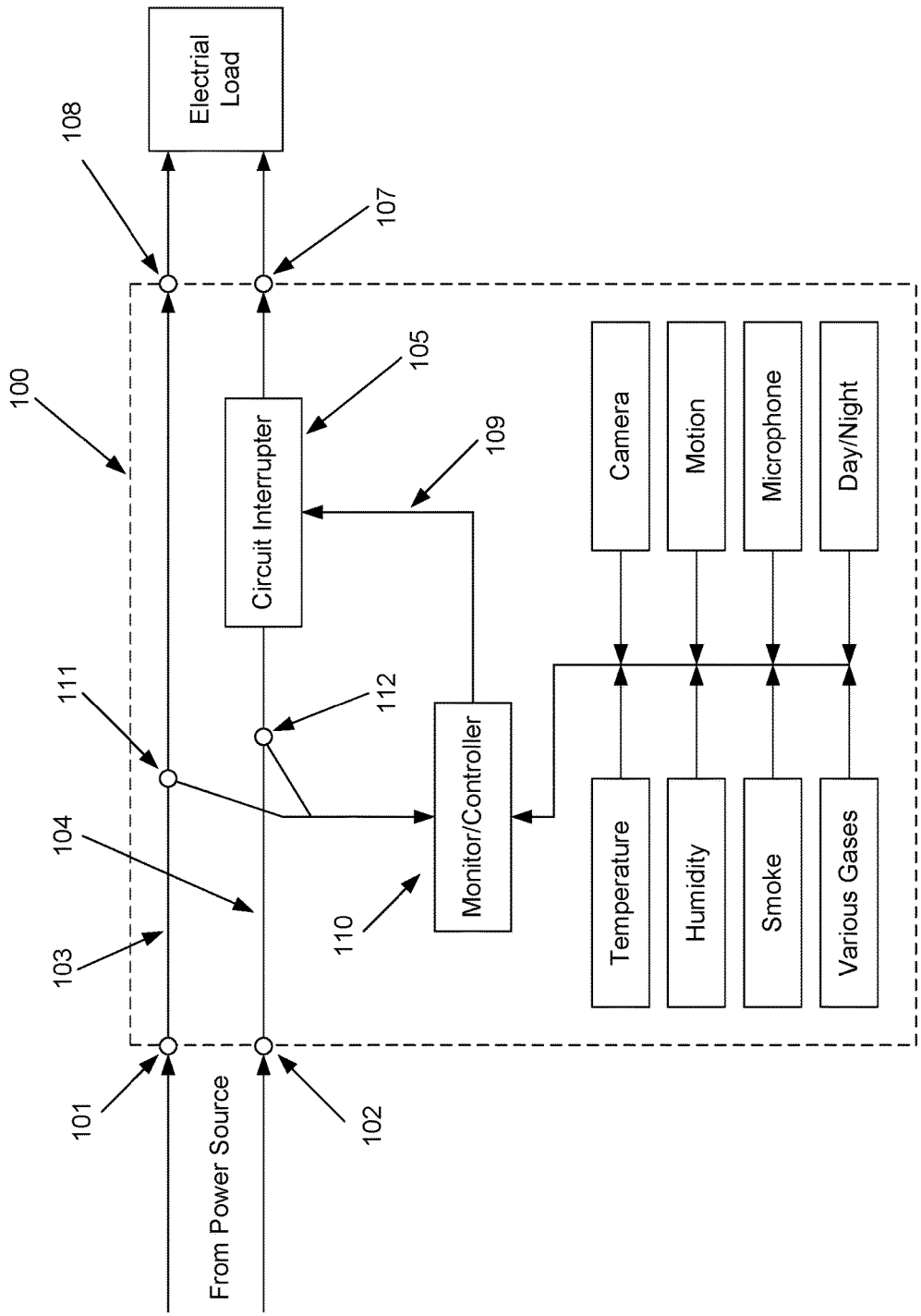
FIG. 9 is block diagram of a further embodiment of a smart power node having a plurality of environmental sensors in accordance with the present invention.

In accordance with the present invention, smart power nodes 100 and 800 may also include one or more sensors for detecting the condition of the environment surrounding the power node as illustrated in FIG. 9.

For example, power node 100 may include temperature, humidity and smoke sensors. The power node may also include sensors for measuring various gases such as natural gas, radon gas and $CO_2$ gas. A camera may also be provided so that a visual record of the environment at any point in time can be created. The camera and a motion detector sensor may also be used to sound an alert when an authorized person enters the area. Similarly, a microphone can be used to detect unexpected sounds, such as someone trying to gain entry to the area.

A sensor can also be provided to sense light conditions. Such a sensor may be used to trigger monitor/controller 110 to turn on a security light at dusk or turn one off at dawn by controlling circuit interrupter 105.

Other sensors, in addition to the ones shown in FIG. 9, may also be included in smart power nodes 100 and 800 as well.

The sensor data is received by CPU 314 in FIG. 3 and can be shared with other smart power nodes and/or forwarded to MCS 216, Private Network Server 211 and/or Internet Server 212, illustrated in FIG. 2, for retention and/or further analysis.

The data from Voltage/Current Sensor 302 shown in FIG. 3 may also be analyzed to determine circuit resistance between one power node and another node, or between one power node and another point on the power distribution system. Such functionality is important to determining circuit degradation over time, such as a nail breaking the insulation on a wire.

After new construction, such functionality may be used to perform a safety check of the entire system. Moreover, a complete map of circuit resistances can be made and used to detect unauthorized modifications to the electrical network which could be used to prevent fire hazards or theft, etc.

This functionality does not have to be packaged with an outlet or power strip, it may be fabricated in the form of an inline module that can be placed inside a wall out of sight. The module may also be externally mounted or inserted into the electrical wiring between an outlet or device and the circuit breaker panel for existing outlets or other devices (such as outdoor pool pumps, spa pumps, etc.)

While the foregoing specification teaches the principles of the present invention, with examples provided for the purpose of illustration, it will be appreciated by one skilled in the art from reading this disclosure that various changes in form and detail can be made without departing from the true scope of the invention.

We claim:

1. An electrical power node, said power node comprising:
a power strip, including:
first and second input power terminals and first and second output power terminals, wherein said input power terminals are adapted for receiving a source of electrical power and said output terminals are adopted for connecting to a load;
a first power line connecting said first input terminal to said first output terminal;
a second power line connecting said second input terminal to the input side of a circuit interrupter and a third power line connecting the output side of said circuit interrupter to said second output terminal, wherein said circuit interrupter selectively interrupts the connection between said second input terminal and said second output terminal;
a fault sensor coupled to said third power line for producing an electrical fault signal when a fault is detected in said third power line, said fault sensor including fault identification circuitry for identifying the type of fault detected by said fault sensor from among a plurality of predetermined fault types, wherein said predetermined fault types include current overload, AFCI, GFCI and AFCI/GFCI fault conditions;
a signal processing unit coupled to said fault sensor for improving the signal to noise ratio of said fault signal;
a fault trigger condition register for storing a response action to be taken for each of said faults detected by said fault sensor, wherein said fault trigger condition register stores a said response action for at least one combination of a plurality of different fault types occurring within a predetermined time of each other;
a fault type register coupled to said CPU for storing the type of fault detected by said fault sensor;
a central processing unit (CPU) coupled to said signal processing unit, to said circuit interrupter, said fault trigger condition register, and to said fault type register;
a real time clock coupled to said CPU, wherein said CPU causes said fault type register to record the approximate time when said detected fault occurred;
a voltage/current sensor coupled to said third power line and to said CPU for producing a voltage signal corresponding to the voltage level on said third power line and a current signal corresponding to the current level flowing through said third power line;
wherein when said current signal indicates the presence of a current level above or below a predetermined current level, said CPU produces a current fault signal and causes said power node to take a predetermined response action; and
wherein in response to said fault signal said CPU controlling said circuit interrupter to interrupt the flow of current in said third power line.

2. The power node of claim 1, wherein said fault trigger condition register stores a said response action for a plurality of fault types occurring within a predetermined time of each other.

3. The power node of claim 1, wherein when said voltage signal indicates the presence of a voltage level above or below a predetermined voltage level, said CPU produces a voltage fault signal and causes said power node to take a predetermined response action.

4. The power node of claim 3, wherein said fault trigger condition register stores at least one response action to be taken by said power node when said voltage fault signal is produced.

5. The power node of claim 4, wherein said CPU causes said fault type register to store said current fault signal and the approximate time when said current fault signal occurred.

6. The power node of claim 1, wherein said fault trigger condition register stores at least one response action to be taken by said power node when said current fault signal is produced.

7. The power node of claim 1, wherein said CPU causes said fault type register to store said voltage fault signal and the approximate time when said voltage fault signal occurred.

8. The power node of claim 1, further comprising a status indicator for providing status information.

9. The power node claim 8, wherein said status information indicates the operating state of said power node.

10. The power node of claim 8, wherein said status information indicates the presence or absence of said fault signal.

11. The power node of claim 8, wherein said status indicator is a light emitting diode.

12. The power node of claim 8, wherein said status indicator is a human voice.

13. The power node of claim 1, further comprising a communications interface for said power node to communicate with a remote device.

14. The power node of claim 13, wherein said communications interface allows communications over a local area network.

15. The power node of claim 13, wherein said communications interface allows communications over a local area network.

16. The power node of claim 13, wherein said communications interface allows communications over a WiFi area network.

17. The power node of claim 13, wherein said communications interface is a power-line communications interface.

18. The power node of claim 13, wherein said communications interface allows communications using a Bluetooth protocol.

19. The power node of claim 13, further comprising an electronic address module for providing a unique electronic address for said power node.

20. The power node of claim 19, wherein said electronic address is an Internet Protocol address.

21. The power node of claim 1, wherein said communications interface is a local area hub.

22. The power node of claim 1, further comprising a plurality of circuit interrupters adapted to protect a corresponding plurality of electric circuits connected to a respective plurality of said output terminals.

23. The power node of claim 22, wherein each circuit interrupter is independently controlled by said CPU.

24. The power node of claim 1, further comprising a temperature sensor coupled to said CPU for measuring the ambient temperature of the area in which said power node is located.

25. The power node of claim 1, further comprising a humidity sensor coupled to said CPU for measuring the humidity of the area in which said power node is located.

26. The power node of claim 1, further comprising a smoke sensor coupled to said CPU for detecting the presence of smoke in the area in which said power node is located.

27. The power node of claim 1, further comprising a gas sensor coupled to said CPU for measuring the presence of gases in the area in which said power node is located.

28. The power node of claim 1, further comprising an ambient light sensor coupled to said CPU for distinguishing between daytime and nighttime.

29. The power node of claim 1, further comprising a sound sensor coupled to said CPU for detecting the presence of sounds in the area in which said power node is located.

30. The power node of claim 1, further comprising a motion sensor coupled to said CPU for detecting the presence of motion in the area in which said power node is located.

31. The power node of claim 1, further comprising a camera coupled to said CPU for recording images of the area in which said power node is located.

\* \* \* \* \*